United States Patent [19]

Mentzer

[11] Patent Number: 5,349,311
[45] Date of Patent: Sep. 20, 1994

[54] CURRENT STARVED INVERTER VOLTAGE CONTROLLED OSCILLATOR

[75] Inventor: Ray A. Mentzer, Portland, Me.

[73] Assignee: National Semiconductor Corporation, Santa Clara, Calif.

[21] Appl. No.: 980,508

[22] Filed: Nov. 23, 1992

[51] Int. Cl.⁵ .................. H03B 5/00; H03L 7/099
[52] U.S. Cl. ..................... 331/57; 331/17;
 331/1 A; 331/34; 331/177 R; 331/175; 331/179
[58] Field of Search ............... 331/1 A, 34, 25, 57,
 331/108 B, 108 C, 17, 175, 179, 177 R; 328/155

[56] References Cited

U.S. PATENT DOCUMENTS

| 4,151,485 | 4/1979 | LaFratta | 331/1 A |
|---|---|---|---|
| 4,517,532 | 5/1985 | Neidorff | 331/57 |
| 4,978,927 | 12/1990 | Hausman et al. | 331/57 |
| 5,036,300 | 7/1991 | Nicolai | 331/143 |
| 5,038,118 | 8/1991 | Langenkamp | 331/57 |
| 5,075,640 | 12/1991 | Miyazawa | 331/10 |
| 5,105,169 | 4/1992 | Yamazaki et al. | 331/34 |
| 5,136,260 | 8/1992 | Yousefi-Elezei | 331/17 |
| 5,142,249 | 8/1992 | Hirotomi | 331/57 |
| 5,182,528 | 1/1993 | Zuta | 331/1 A |
| 5,208,557 | 5/1993 | Kersh, III | 331/57 |

OTHER PUBLICATIONS

"MOS Oscillators with Multi-Decade Tuning Range and Gigahertz Maximum Speed", by M. Banu IEEE JL. of Solid State Circutis Dec. 1988 vol. 23 #6 p. 1386.
"A Variable Delay Line PLC for CPU-Coprocessor Synchronization", by M. Johnson and E. Hudson IEEE JL of Solid State Circuits Oct. 1988 pp. 1218-1223.
"Design of PLC Based Clock Circuits" by D. Jeong et al. IEEE JL. of Solid State Circuits vol. SC-22 #2 (Apr. 1987) pp. 255-261.

Primary Examiner—Benny T. Lee
Assistant Examiner—Arnold Kinkead
Attorney, Agent, or Firm—Thomas L. Bohan; Chris A. Caseiro

[57] ABSTRACT

A voltage controlled oscillator (VCO) operating as a variable length, variable delay, ring oscillator having a current starved inverter and an anti high-gain circuit for each stage. A VCO feedback signal is compared with a reference frequency obtained, for example, from a system crystal oscillator. A phase and frequency detector monitors these two input signals and issues "up" or "down" commands to a digital counter. This digital counter delivers select signals via a decoder and also drives a Digital to Analog Converter ("DAC"). The digital select signal from the counter chooses an operational stage from the multi-stage, tandem-connected VCO. A broadband operation for the VCO is achieved by overlapping the individual frequency ranges associated with each of the individual stages. The DAC moves the operation along each selected frequency range associated with a selected stage until a system lock between the VCO output and the crystal references is achieved.

16 Claims, 8 Drawing Sheets

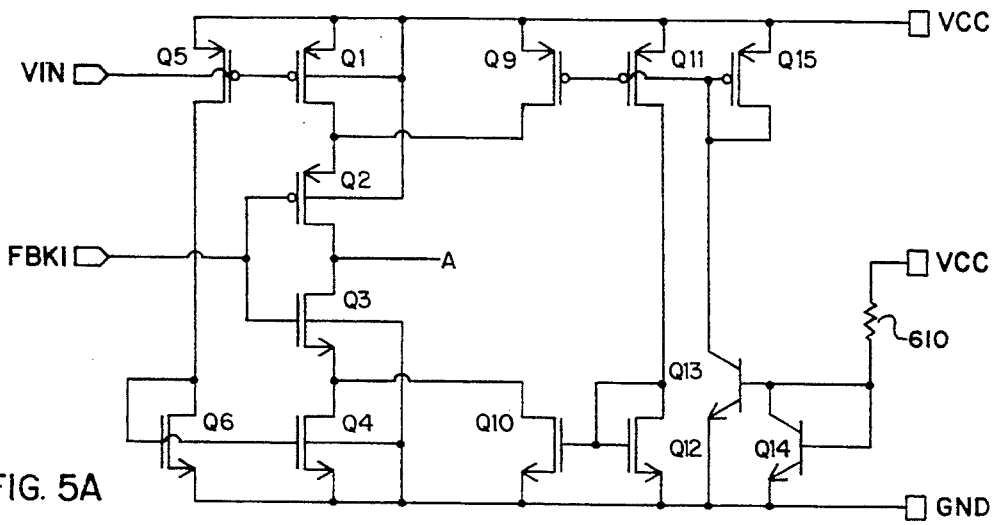
FIG. 5A
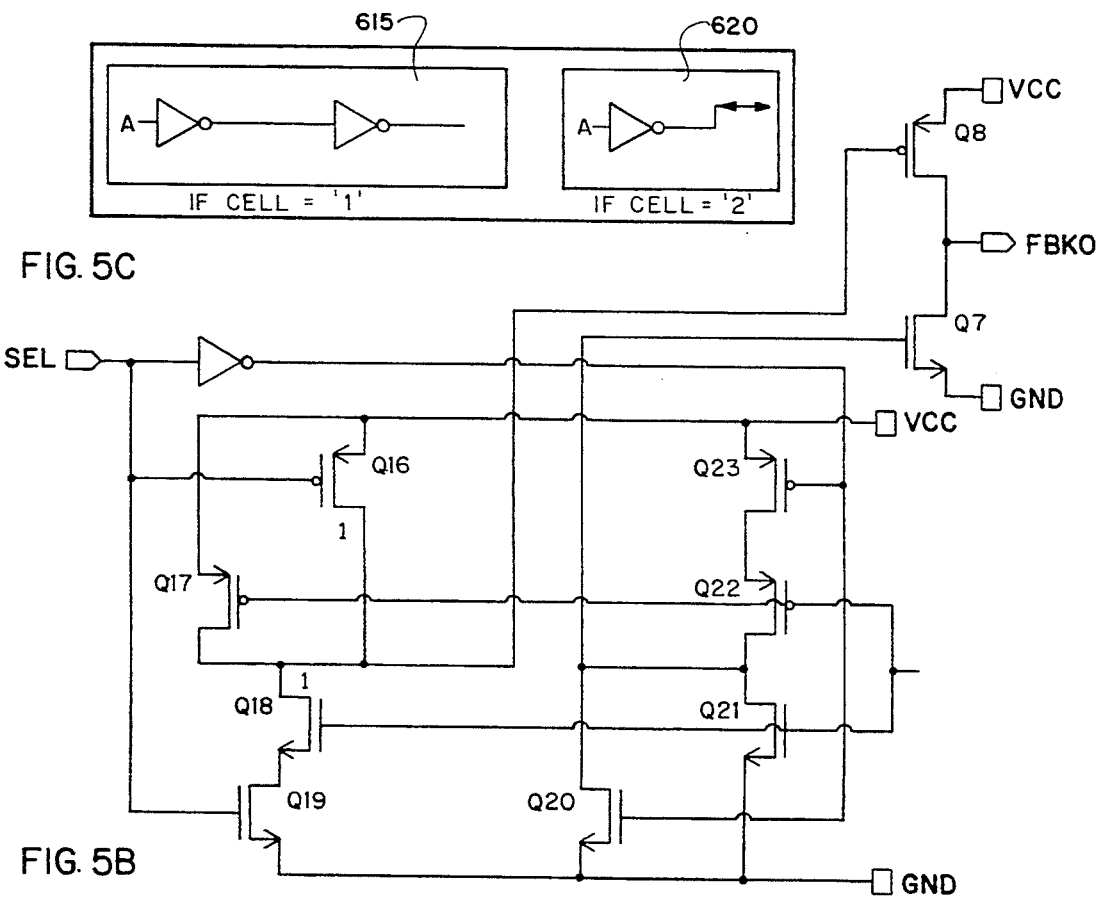
FIG. 5C
FIG. 5B
FIG. 5

CURRENT STARVED INVERTER VOLTAGE CONTROLLED OSCILLATOR

TECHNICAL FIELD

The technical field of the invention includes phase locked systems generally and a variable length, variable delay ring oscillator, in particular. More particularly, the technical field includes a low voltage, broadband voltage controlled oscillator employing in each stage thereof a current starved inverter circuit and an anti high-gain circuit for linearized a low gain frequency characteristic for each particular stage.

BACKGROUND ART

Phase-lock systems for variably moving one signal in frequency/phase until it matches or "locks" with another reference signal are well known. Likewise, voltage controlled oscillators as an element in such systems are also well known in the art.

As a general rule voltage controlled oscillators are confined to a narrow frequency range, and the controllable frequency variations are also within a narrow frequency band about a center, or reference frequency. The reference frequency is determined by the given oscillator's design configuration.

As semi-conductor and "chip" technology has spread, the design criteria for many circuits, including voltage controlled oscillators, has become increasingly rigorous. For example, current chip technology demands low power consumption, i.e. low operating voltages, and high noise immunity over increasingly expanding frequency ranges. Today's technology also seeks linearity over a broadband frequency range. These operational requirements eliminate many of the conventional prior art approaches.

Typical examples of two major candidates for conventional oscillator design approaches are set forth in two related articles entitled *Design of PLL-Based Clock Circuits*, by Deog-Kyoon Jeong et al published in the IEEE Journal of Solid State Circuits, Vol. sc-22, No. 2, April 1987, pages 255 through 261 and *A Variable Delay Line PLL for CPU-Co-processor Synchronization* by Mark Johnson and Edwin Hudson, published in the IEEE Journal of Solid State Circuits on Oct. 18, 1988 at pages 1218 through 1223. These articles describe two different oscillator techniques.

In one technique a control voltage is applied to a series-connected element that "current starves" an inverter. In the second approach, employing a bipolar multi-vibrator, the control voltage in essence varies a load capacitance. FIG. 3a at page 1219 of the Johnson and Hudson article depicts a CMOS current starved oscillator design, while FIG. 3b of that same article depicts a shunt capacitor delay stage.

Several cells in the Johnson article were cascaded together to afford a desired amount of delay adjustment range as shown, for example, in FIG. 5, of that paper. Of considerable interest is the fact that the designers elected to go with the shunt capacitor delay cell for a cascade circuit approach. Apparently a major factor in their design consideration was the severe non-linearity of the current starved approach.

In FIG. 4 of the Johnson article, delay time as a function of control voltage is shown for both the current-starved and shunt-capacitor techniques. The current starved inverter's delay propagation, as the control voltage moves toward zero, goes asymptotically toward infinity. A single stage, or cell, shows a frequency range of about 17 Mega Hertz (MHz) with a gain of about 12 MHz per volt. If a design criteria specifies linearity and a 3 volt operating range, the best case gain is about 180 MHz/3 volts or about 60 MHz per volt.

However, as shown in FIG. 4 of the reference, the circuit's characteristic is extremely non-linear and has high gain regions. Such high gain brings about numerous drawbacks including low noise immunity. In addition, the steep slope of the delay characteristic shown for the lower-voltage operational range of the current starved approach, generally indicates a noisier circuit operation. Thus, an unstable high gain region is present in the circuit approach of FIG. 3a, which tends to unduly multiply spurious noise signals. A spurious noise signal, for example, on a control lead would be multiplied many times by the circuit's high gain. For these reasons the classic current starved technique is often rejected for consideration in oscillator design.

In spite of the above-noted deficiencies of conventional current starved inverter approaches, however, the inventor has persisted and has invented a broadband, low power, and highly noise free voltage controlled oscillator circuit based upon a current starved inverter cell. In the novel approach of the invention, the troublesome high gain area is eliminated by an anti-high-gain circuit. The result is a highly improved low gain current starved inverter cell. Moreover, by combining a series of the improved low gain cells in a variable length, variable delay ring oscillator, a broadband frequency range is provided which was not heretofore thought possible in the art.

OBJECTS OF THE INVENTION

It is an object of the present invention to provide a low gain CMOS current starved inverter cell having an anti high-gain circuit in parallel with the inverter.

It is another object of the present invention to provide a broadband approximately linear operation for a voltage controlled oscillator which employs a series of tandem-connected improved low gain inverter cells.

It is still a further object of this invention to provide a broadband oscillator having a family of linear gain curves, which family is comprised of individual curves each associated with an individual stage of a multi-stage tandem-connected ring oscillator.

It is still a further object of this invention to automatically select the proper phase and frequency from that family of curves by selecting both the proper curve and the correct operating point on that selected curve in order to achieve a system "lock".

It is another object of this invention to automatically select one curve from the family of curves which is the proper individual curve having the desired matching frequency by use of a digital signal, and also to select the exact operating point along that selected curve by using an analog selection command.

Another object is to eliminate the unstable high gain region normally associated with a current starved inverter cell by connecting an anti-high-gain circuit in the inverter cell.

It is still another object of the invention to develop a low gain characteristic that provides a maximum delay through each improved current starved inverter cell.

It is yet another object of this invention to provide both analog and digital control signals for a variable length, variable delay ring oscillator constructed of improved low gain current starved inverter cells each having an anti-high-gain circuit.

It is still another object of the invention to provide a low gain voltage controlled oscillator operating over a frequency range of about 10 MHz to about 270 MHz.

It is still another object of the invention to provide a low gain voltage controlled oscillator that has an essentially linear frequency vs. input voltage characteristic curve for each cell in the ring oscillator, with the individual characteristic curves overlapping one another in order to provide an unbroken transition from curve to curve over the broadband frequency range covered by the oscillator.

DISCLOSURE OF THE INVENTION

This invention, in its broadest concept, includes a voltage controlled oscillator operating as a variable length, variable delay, ring oscillator. The ring oscillator, after a master reset, adjusts a feedback signal that is originally compared with a reference frequency obtained, for example, from a crystal oscillator in the overall system control sequence. A phase and frequency detector 130 monitors the two input signals and issues up or down commands on leads 106 and 107, respectively, to a an eleven bit counter 140. Of the eleven bits from counter 140, the three most significant bits drive a one of eight decoder 160. The eight least significant bits drive an eight-bit Digital to Analog Converter ("DAC").

The invention's ring oscillator has both a coarse and a fine adjustment. The coarse adjustment is accomplished by the above-mentioned three-bit digital word. One out of eight digital control bits from the decoder 140 are applied to eight separate tandem connected stages of the ring oscillator in order to select a given output stage for the ring oscillator. This one out of eight selection is based upon the status of the three bit word. The length of delay in the oscillator is set by this one out of eight selection because that selection controls the circulation time for a signal fed back to the input stage from the selected output stage.

The DAC output is an analog fine tuning control signal for the ring oscillator. A digital to analog converter responds to the up/down commands by developing analog control voltages which are applied to selected stages of the tandem cells in the ring counter. Each individual stage of the ring oscillator has an anti-high-gain circuit in order to hold the gain of each current starved inverter cell at a low value. Essentially linear characteristics for each stage are thus developed. Just as the various cells are interconnected to form a ring oscillator, the various individual characteristic curves of each individual linear current starved cells overlap from one cell to the next so that the entire frequency spectrum of the ring oscillator is covered.

As the reference and the signal of the feedback are compared, the oscillator advances along the individual curves of a family of curves so that the final correct frequency and phase is achieved to match the system's reference.

BRIEF DESCRIPTION OF THE DRAWING

FIG. 3A is a simplified circuit diagram for a typical CMOS delay cell and logic select/feedback circuit such as those shown in block form in FIG. 2. FIG. 3B is a waveform useful in describing the manner of varying the delay for a given cell.

FIG. 5 includes FIGS. 5A, FIG. 5B and FIG. 5C. FIG. 5A is a more detailed circuit schematic of a typical low gain current starved inverter cell having an anti-high-gain circuit in accordance with the invention. FIG. 5B is a schematic of a three state buffer and a more detailed logic select circuit in accordance with the invention. FIG. 5C depicts two different type block layouts useful in understanding the connection of various types of cells of FIG. 2.

FIG. 8 is the first derivative of FIG. 7.

DESCRIPTION OF PREFERRED EXAMPLE EMBODIMENT AND BEST MODE OF THE INVENTION

Figure 1:
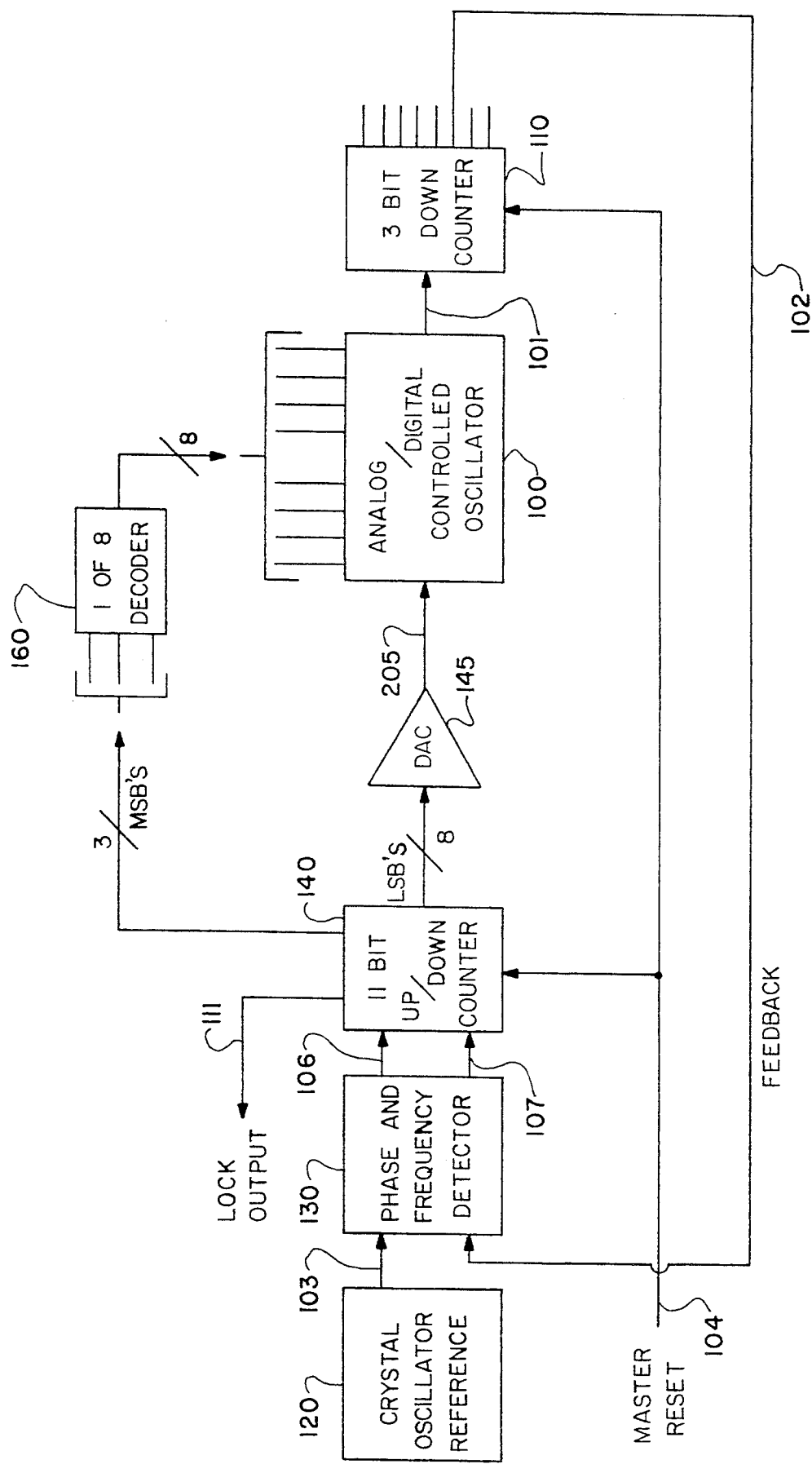
FIG. 1 is a simplified block diagram of a system including the voltage controlled oscillator invention of this application.

The system for the voltage controlled oscillator ("VCO") of this invention is shown in FIG. 1. The voltage controlled oscillator in block diagram form is circuit 100 in FIG. 1. The system will search along individual curves from a family of frequency range curves, and will automatically issue a "lock" signal on lead 111 when a stable circuit operation has been achieved by any lock technique known in the art. Such a "lock" at lead 111 means that the input from a crystal oscillator reference source 120 and a feedback signal from ring oscillator 100 have been brought into substantial agreement in phase and frequency.

Crystal source 120 supplies a reference signal to the system. That reference signal is an input signal on lead 103 and is applied to the phase and frequency detector 130. Crystal source 120 may represent any given source such as an overall system clock, and is a highly stable frequency source. Once the system becomes "locked" it is generally a stable system condition. Thus, a new "lock" need not be achieved unless some circuit disturbance occurs.

System stability for the operating frequency may be disturbed suddenly by a dramatic temperature change, such as someone opening a cabinet. Another type of disturbance would occur if a repairman installed a new module. In any of these types of events, it is important that VCO 100 follow that change automatically and again lock in with the crystal phase/frequency.

This invention provides that lock automatically and has eliminated RC components normally associated with a phase lock loop filter. Moreover the lock is achieved automatically even if several frequency range changes are required. The invention thus provides a low gain broadband system approach in the novel manner now to be described.

The system of FIG. 1 requires an initialization. That initialization takes the form of a master reset pulse on lead 104. A master reset, lead 104, is provided to counters 110 and 140 and it clears these counters to a predetermined starting state. For example, the octal up/down counter 140 and the three bit down counter 110 may initially be cleared to an all zero condition by a master reset pulse on lead 104.

This master reset, as will be shown hereinafter, starts the voltage controlled oscillator 100 at an operating point on a family of curves that will surely be well below the most likely stopping point for a system lock. That is to say that the starting point at initialization, is lower in frequency than the likely stopping point after the system is "locked" in phase and frequency. The system is "locked" when VCO 100 through counter 110 generates a signal that is substantially in step with the phase and frequency of the reference source.

Phase and frequency detector 130 is capable of emitting either an "up" or a "down" command on output leads 106 or 107. As a result of the above-described starting reset condition, the phase and frequency detector 130 will, at first, always be registering an "up" command on lead 106. "Up" and "down" commands will run the VCO through a wide frequency range until a "lock" occurs. As VCO 100 comes closer to matching the phase and frequency being output from VCO 100, the system operation will at first overshoot the lock point and then "down" commands will be issued at lead 107 from detector 130. Ultimately, when a "lock" is achieved, the circuit will vacillate a small incremental amount both above and below the "lock" frequency.

In response to an "up" command at counter 140, an eight-bit digital word is applied to the eight bit digital to analog converter ("DAC") 145. The three most significant bits from counter 140 are a byte that is applied to drive a one out of eight decoder 160. An output from counter 160 is a select signal in the form of a digital byte, or word, for selecting an operative length for circulating a signal within voltage controlled oscillator 100.

VCO 100 receives both an analog and a digital signal for its control commands. These control commands are supplied from DAC 145 and decoder 160. As will be shown, the ring oscillator operates as a variable length, variable delay, ring oscillator. The ring oscillator 100 thus has both a coarse and a fine adjustment. The coarse adjustment is accomplished by a digital signal which selects the length of the ring oscillator. This digital, or coarse adjustment, is provided by the one out of eight decoder circuit 160. One out of eight possible select lines can go high at any given time. That one high line from select circuit 160 selects one out of eight separate tandem connected stages of the ring oscillator.

Each stage of oscillator 100 oscillates with a conducting/non-conducting frequency appropriate for that stage. Several such stages are cascaded together in order to form a broadband spectrum as will be described in greater detail hereinafter. Suffice it to say here that each stage in progression covers a frequency range that is extended by the next stage, which is also extended by the next stage, and so forth to form the entire broadband operating spectrum for the system of this invention.

A variable delay for the ring oscillator is selected by a fine adjustment as provided by an analog input signal from DAC 145. DAC 145 responds to the up/down commands from circuit 130, via counter 140, by developing digitally generated currents at its output. These currents are converted into analog control voltages, and those analog control voltages are applied in common to most, if not all, of the stages of the ring oscillator depending upon the various operational temperature requirements of an individual VCO design.

Figure 2:
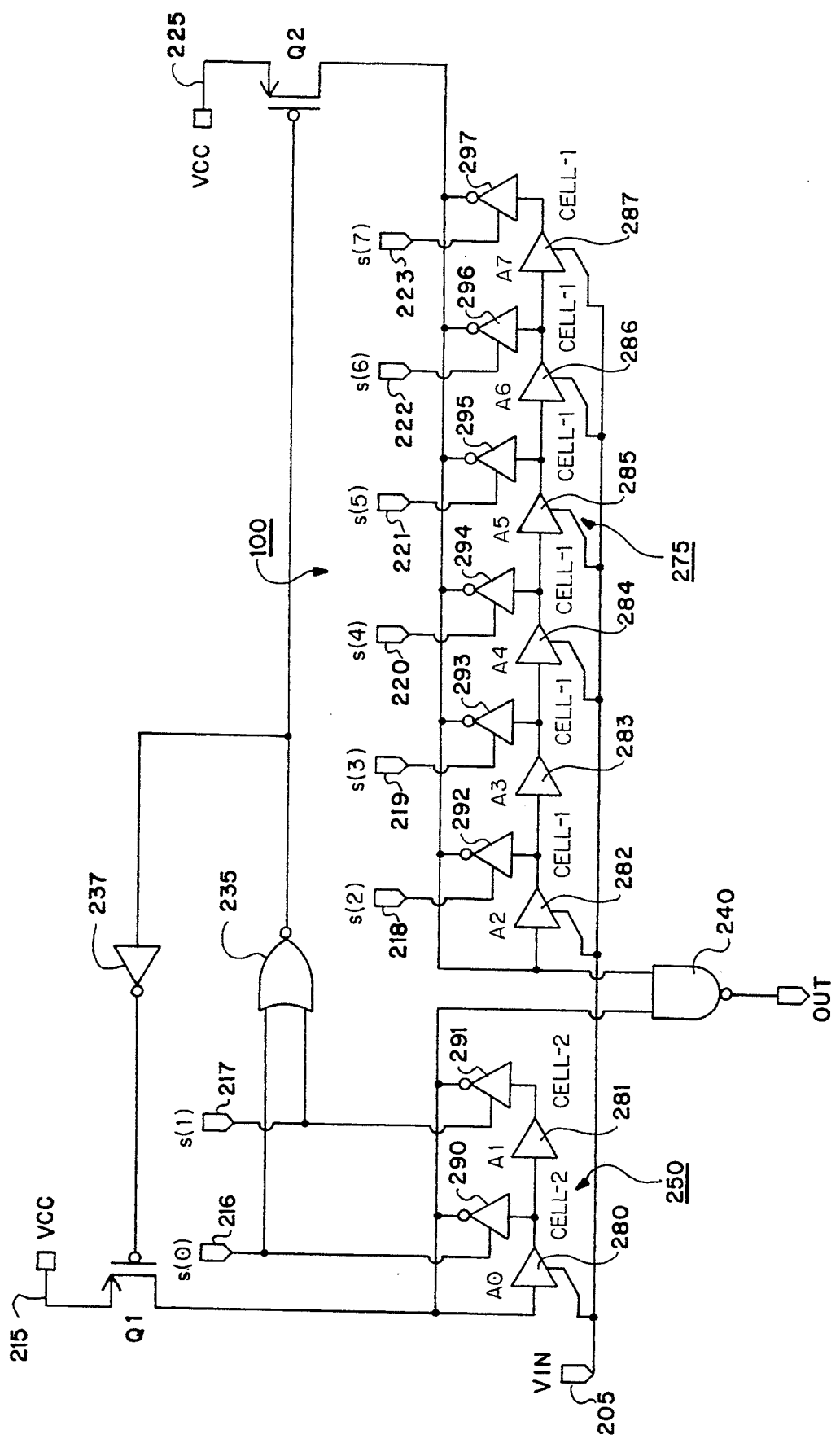
FIG. 2 is a block diagram of a voltage controlled oscillator invention.

In FIG. 2 the VCO is shown in more detail and consists of eight tandem connected stages labeled A0 through A7. In principle, the ring oscillator 100 may be a single section; or, as shown in FIG. 2, it may have both a faster and a slower section shown as sections 250 and 275. Output from selected stages are fed back to the input of an earlier stage. Above the stages A0 through A7 are a series of select terminals labeled S(0) through S(7). Such select circuitry chooses a particular stage that is operable in ring counter 100 at any given time.

Each stage includes two major circuit elements shown simply as triangular-shaped block symbols in FIG. 2. One element in each stage is a delay, or current starved cell, and the other is a select circuit for controlling feedback from one stage to the same or an earlier stage. In ring oscillator 100, a feedback path completes a round trip signal path that determines the time and thus the frequency of the ring oscillator 100. For example, the signal path completed by selection of the first stage, A0, of ring counter 250 at the extreme left hand side of FIG. 2 is the fastest, or highest, frequency stage.

Conversely, a signal path completed by stage A7 at the right hand side of ring oscillator section 275 is the slowest, or lowest, frequency stage. Quite obviously signal paths completed by selection of intermediate stages will establish other mid-frequency ranges. The significance of the family of frequency ranges associated with these individual stages and their own unique operational frequency ranges will be described later in connection with a detailed description of FIG. 7.

An input lead labeled 205 of ring oscillator 100 receives an analog control signal from DAC 145 and applies that control signal in common to certain of the cells 280 through 287 in the several tandem-connected stages A0 through A7 of the ring oscillator 100. Thus when two sections 250 and 275 are employed the control signal is applied to cell 280 in oscillator section 250 and is applied to cells 282, 284, 285, 286 or 287 in slower section 275.

Let us look now at a typical stage A0 as shown in block form in FIG. 2. The first stage A0, when chosen by a select signal on terminal 216, enables a three state select circuit 290. With circuit 290 enabled, a feedback connection from circuit 290 is supplied directly into the input of cell 280. A feedback output signal (sometimes hereinafter referred to as "FBKO") is fed back over the connection as shown to a linearized current starved inverter cell 280 of this invention. Stated more simply FBKO from 290 becomes the input, ("FBKI") of delay cell 280 in input stage A0.

Before describing some of the circuit details of FIG. 3A and FIG. 3B, it is deemed important to observe some broad functional aspects of the invention. Each individual stage of the ring oscillator is connected to an anti high-gain circuit in order to hold the gain of each current starved inverter cell at a low value. The absence of a high gain characteristic is reflected as essentially a uniform and linear delay function for each cell equipped with the anti high-gain circuitry of the invention. Moreover, each cell is adjusted in value so that each individual cell's delay curve overlaps in frequency range with the frequency range of an adjacent tandem-connected delay cell.

Just as the various cells are interconnected to form a ring oscillator, the various characteristic curves of each individual cells overlap from one cell to the next so that the entire frequency spectrum of the ring oscillator is continuously covered. For example, if a first frequency range of a first cell is from about 10 Mhz to about 45 MHz then the next cell will have a frequency range of about 20 MHz to about 60 MHz. Each cell's operation at about mid-frequency range is thus linear and overlaps with an adjacent cell so that the entire frequency range of this broadband VCO is evenly covered by the various tandem delay cells. The various individual curves of the cells thus forms a family of overlapping frequency curves (i.e. delay curves) that are a feature of the claimed invention.

As the reference input signal and the feedback signal are compared, the oscillator advances progressively from individual curve to curve within the family of curves. Advancement continues automatically until a final correct frequency and phase match with the system reference is achieved. Although this form of ring counter operation means some frequency areas are retraced in obtaining the "lock", it is nevertheless, a safe and fail-proof solution to a heretofore unsolved problem.

Figure 3:
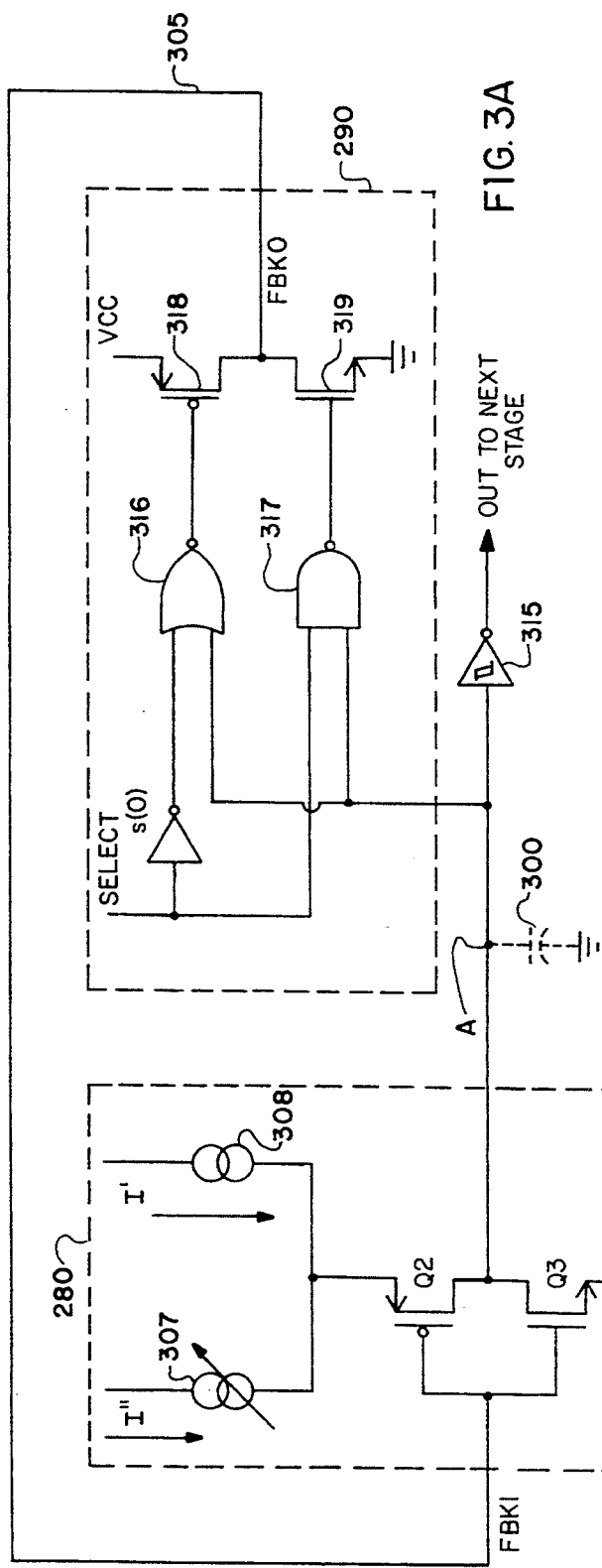
FIG. 3 includes FIG. 3A and 3B.
Figure 3:
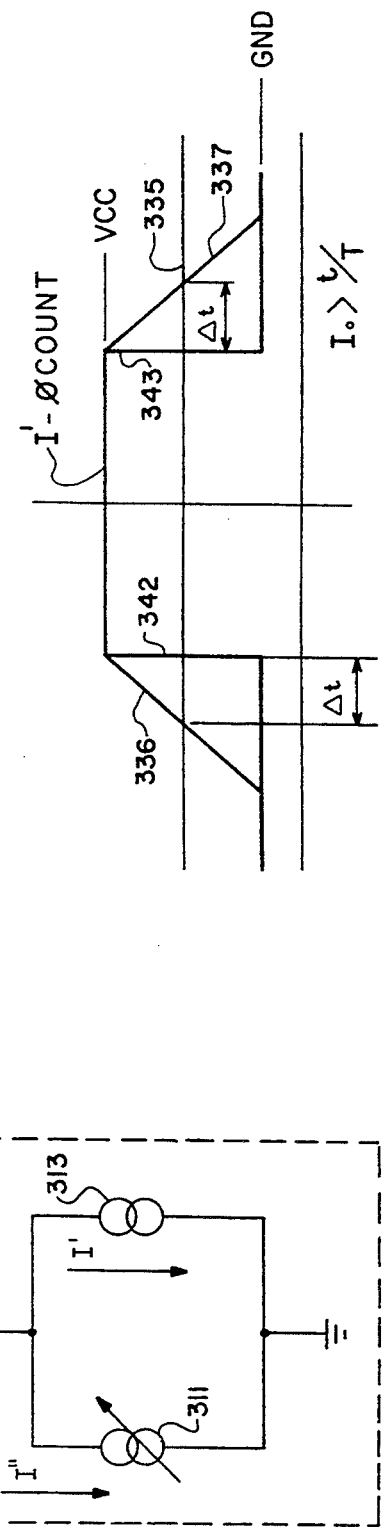

FIG. 3 depicts a typical stage, such as stage A0 of FIG. 2, in more detail. Select circuit 290 is shown in dashed lines as supplying a feedback term FBKO on lead 305, which term is fedback to become the input term FBKI for cell 280 also shown in dashed lines. Input term FBKI at cell 280 is received by the two P and N type MOS transistors Q2 and Q3, respectively. Q2 and Q3 act essentially as switches for supplying two separate current amounts to a capacitor 300. Transistor Q2 delivers charging current from two current sources shown simply in symbol form as sources 307 and 308. Thus, Q2 is in a charging circuit for capacitor 300, while Q3 is in a discharging circuit for 300. Q3 removes charge from capacitor 300 through two other current sinks 311 and 313.

Capacitor 300 is at a node control point A in the circuit of FIG. 3. Capacitor 300 is shown dashed to indicate that it is a parasitic capacitance associated with the circuit design in chip form. Capacitance 300 is the summation of metal wiring capacitance on this node, gate capacitance loading of inverter 315, and source-/drain capacitive loading of Q2 and Q3. This various stray capacitance is lumped together and shown simply in dashed form as capacitance 300.

Connected to the capacitor 300 is another inverter 315 which is a subsequent current starved inverter cell connected to node point A. Also connected to node point A is an input lead for a pair of select gates 316 and 317. The output of gates 316 and 317 is through another inverter pair 318, 319 to develop a FBKO signal that is fed back to an earlier inverter cell.

Current source 307 and current sink 311 are shown variable in simplified form in order to indicate that they vary the amount of current labeled in FIG. 3A as I". This variable current amount I" for these elements is controlled in amount by the strength of the analog input signal from DAC 145, FIG. 1. Current source 308 and current sink 313, on the other hand, handle fixed current amounts. Elements 308 and 313 constitute an anti-high gain circuit for the invention.

Figure 4:
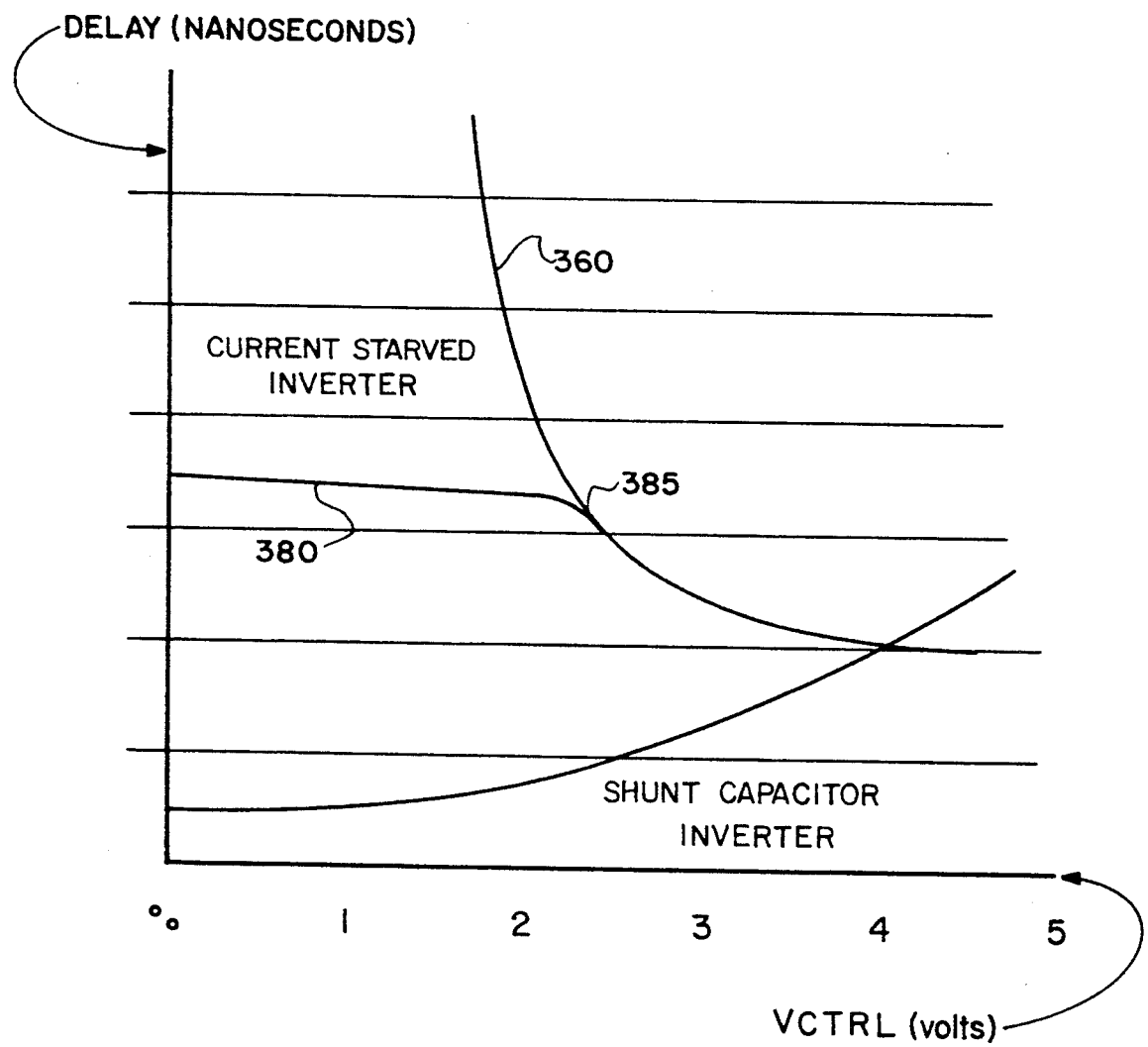
FIG. 4 is a delay curve as a function of control voltage and shows a prior art nonlinear curve and the improved linearized curve of the invention.

The anti-high gain circuit for this invention may better be understood by digressing briefly to a discussion of the delay curve as shown in FIG. 4. FIG. 4 is a graph of circuit delay versus input voltage. A standard nonlinear delay curve 360 is shown in FIG. 4 and it compares to that same curve as shown in FIG. 4 of the prior art Johnson et al paper. Curve 360, although somewhat linear from about 5 to 3 volts, goes very non-linear below a control voltage of about three volts. The point where non-linearity begins is designated 385.

Curve 360 above point 385 is a high gain region. In that region the propagation delay will rise to infinity in accordance with the prior art. At infinity, of course, the frequency is zero. In accordance with this invention, the prior art non-linearity is corrected and controlled by an anti-high-gain circuit provided for each current starved cell in the voltage controlled oscillator of this invention.

Conceptually, the function of an anti high-gain circuit (as symbolized in FIG. 3A by the fixed current sources 308 and 313) is to form curve 380 at point 385. Thus, at about point 385 where serious non-linearity of the prior art commences, the linearized low gain inverter circuit of this invention reflects a fixed delay amount which remains stable from point 385 to a zero control voltage where curve 380 intersects the vertical, or delay, axis.

Note that the amount of delay shown by curve 380 is constant over the operating range of interest for the inverter control voltage with the anti high-gain circuit for each stage of the VCO in accordance with this invention. In brief summary, the anti high-gain circuit supplies a fixed current supply that prevents the prior art delay curve from going toward infinity. Rather, the fixed current supply continually charges and discharges a node control point A to hold the delay constant.

FIG. 3B is a signal curve that is useful in understanding the nature of the variable signal as represented by variable sources 307 and 311 in FIG. 3A. In FIG. 3B the output current is shown along the horizontal axis. A midpoint range 335 is located between ground and VCC. A charging sequence for capacitor 300 is indicated by the rising edge of the curve while a discharging sequence is represented by the falling curve.

In operation a sequential series of charging/discharging slopes take place in accordance with the output from DAC 145, FIG. 1. The current for this inverter stage is I' less whatever the DAC count, $\phi$, may be at the particular instant in question. Thus as shown on FIG. 3B, the current is given by the formula I'$-\phi$ count, where the count is from 0 to 256 for the counting sequence for DAC 145. Obviously the shortest charging/discharging time is at 342, 343 whereas the longest is at 336, 337.

The change in delay time for a given cell, shown in FIG. 3B as delay "t" is a variable and is directly related to the period "T" for any given stage. This delay "t" is inversely proportional to the change in current I' for FIG. 3A. The period "T" is determined by the round trip time of a circulating signal from output stage, to input stage, and back again.

Any operating region in between these minimum and maximum ranges can readily be selected by varying the input current from DAC 146. Recalling that capacitor 300, C, is charged and discharged in a count, the charging is in accordance with the well known I equal to C dV/dt. Each cell of the circuit operates in the manner just described for this typical cell 280.

An anti high-gain circuit supplies a fixed current source in parallel with that being varied by the DAC. This fixed current source is set at a small fractional amount of the percentage available from the DAC 145, FIG. 1. A typical fractional amount of the fixed current may be in the order of about five percent of the variable current from DAC 145. Whereas the gain in the prior art went to infinity, that does not happen in the linearized low gain cell of FIG. 3A or FIG. 5.

A current starved inverter in more circuit detail is shown in FIG. 5A. FIG. 5 includes FIG. 5A which shows a more complete schematic for the cell while FIG. 5B show more details for the select circuitry. In operation, FIG. 5A and FIG. 5B are similar to that described earlier for FIG. 3A. Most of FIG. 5 is thus understood by a simple straightforward comparison with the description for the earlier FIG. 3A.

The inverter of FIG. 5A includes P and N-type MOS transistors shown as Q1 through Q6. Transistor Q5 has a gate voltage drop that sets the current flow in transistor Q6. By virtue of an area relationship between Q6 and Q1, the amount of current in Q1 is established. Q1 is thus a current source for charging capacitance 300. Likewise Q4 is a current source for discharging capacitance 300 in the manner earlier described for element 313, FIG. 3A.

Q2 and Q3 may be thought of as control switches for Q1 and Q4, with Q1 and Q4, as noted above, being current sources for charging and discharging capacitor 300. Thus, the upper P-type MOS transistors serve to charge the capacitor 300 toward the upper rail voltage, VPS. The lower N-type MOS transistors serve to discharge the capacitor 300 to ground GND. In standard inverter operation, capacitor 300 is charged from rail (VPS) to rail (GND).

In the select circuit of FIG. 5B, the N and P type MOS transistors Q20 through Q23 form a Nor gate comparable to gate 316 in FIG. 3A. Transistors Q16 through Q19 form a Nand gate comparable to Nand gate 317 of FIG. 3A, while Q7 and Q8 are comparable to 318 and 319 in FIG. 3A and serve to output the term FBKO.

In FIG. 5A Q9, Q10, Q11, and Q12 form a current mirror and a P type MOS transistor Q15 and two additional transistors Q13 and Q14 with resistor 510 and potential source, Vcc, form a stable independent reference source. This independent source supplies precisely the correct amount of current to the circuit of FIG. 5A. Q15 is larger than Q11 and by an area relationship supplies the proper amount of charging current to the anti-high gain circuit formed by elements Q9 through Q12. The stability of this independent supply source and the precise amount of metered currents as provided are important technical aspects of this invention.

FIG. 5C shows two separate legends that are useful in conjunction with FIG. 2 to understand the connection of the various stages. Block 515 has a legend—if Cell equals "1"—to show that the connection for cells such as A2 through A7 in FIG. 2. Block 520 shows an inverter for repeating point A and a double headed arrow on the output terminal. That double-headed arrow reflects a connection for cells such as stages A0 and A1 in FIG. 2.

The manner in which the invention assures broadband frequency control over a wide range at low gain for the VCO of this invention will now be described. Each cell's individual oscillating operation are frequency spaced from its adjacent neighboring stage's oscillating frequency. The cells each have an individual frequency curve that varies from a lower to a higher frequency in accordance with the value of analog current supplied to that cell from the DAC 145, FIG. 1. These individual curves form a family of curves as shown in FIG. 7.

Figure 7:
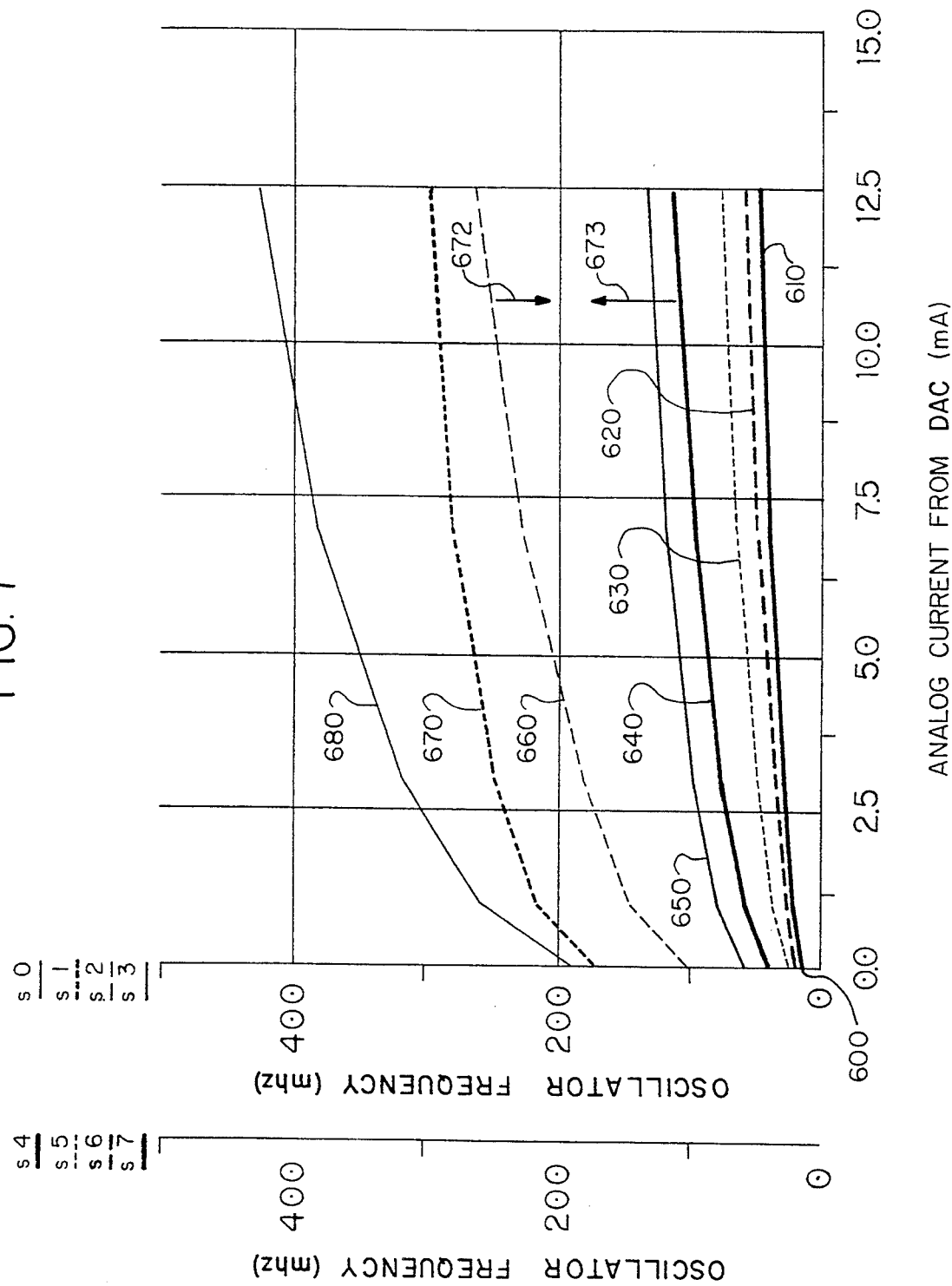
FIG. 7 is a waveform of ring oscillator frequency as a function of an digital voltage input signal and analog current converted into a control voltage applied to the ring oscillator of the invention.

In FIG. 7, the starting and ending frequencies for each adjacent cell overlap with the starting and ending frequencies of adjacent cells in the VCO. Overlapping these cells forms an extended frequency range for the novel VCO of this invention.

Figure 6:
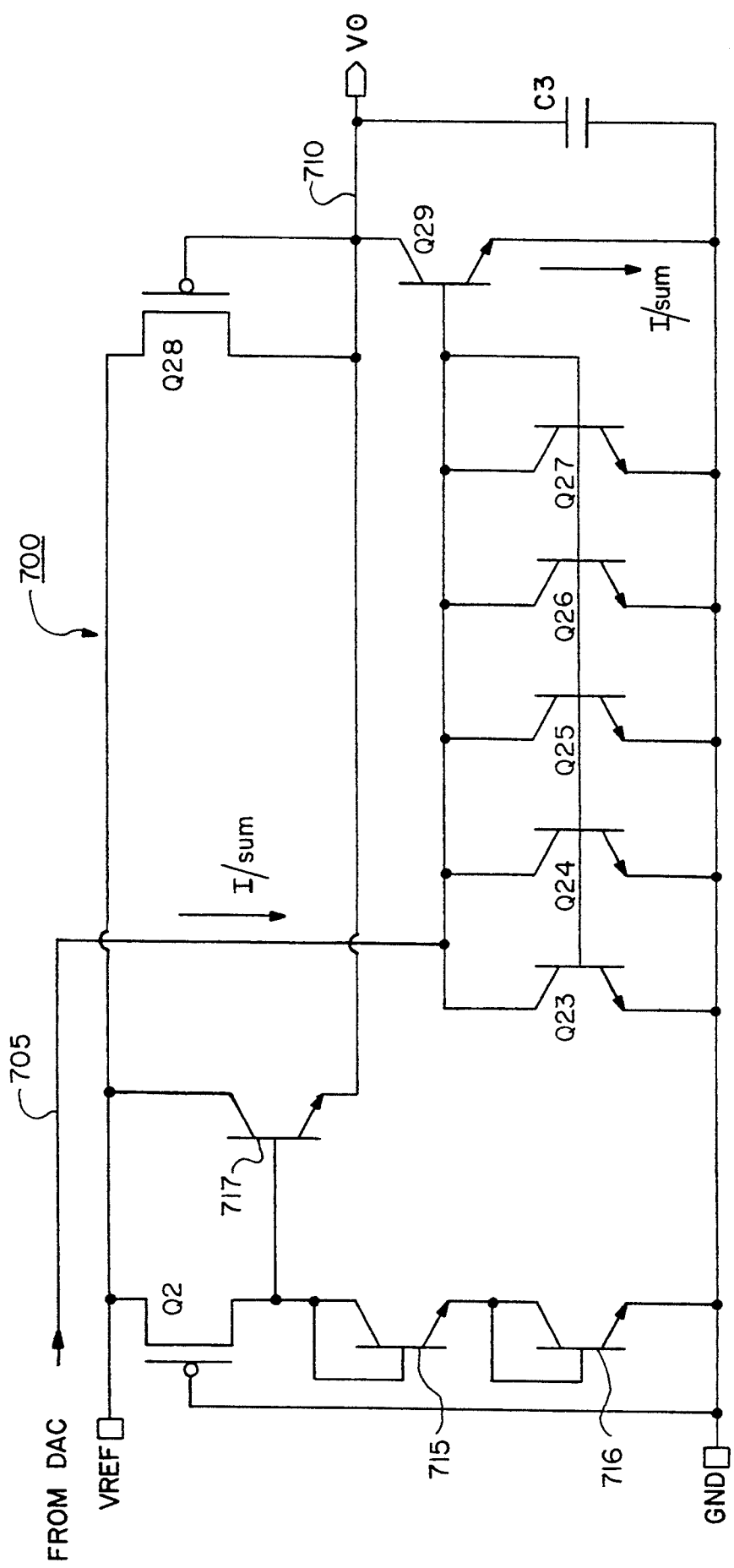
FIG. 6 is a circuit schematic of a digital to analog converter sense amplifier useful in fully describing the VCO of this invention.

The cell of this invention receives a digitally controlled current from DAC 145, FIG. 1, which current is first converted to a control voltage in the sense amplifier 700 of FIG. 6 before it is supplied at input lead 205 of VCO 100.

As shown in FIG. 6, sense amplifier 700 has a stable reference formed by Q2 in series with two QE2 bipolar transistors 715 and 716. Transistor 717 acts as a clamp to avoid saturation in Q28 as Q28 reflects the reference voltage from Q2 across the source and drain leads of Q28. Q28 and Q29 form a current mirror for regulating the output signal at output lead 710 so that the voltage that is there presented is proportional to the sum of the segment currents applied by DAC 145, FIG. 1, to the circuit of FIG. 6.

Sense amplifier 700 receives equal amounts of digitally metered segment currents from DAC 145 at input 705. Input 705 is tied in common to the collector leads of Q23 through Q27 which form the amplifier per se. Shorted base-to-collector drive is supplied in common for these bipolar amplifier transistors, Q23 through Q27 which act as diodes in the sense amplifier. Transistors Q23 through Q27, in turn, supply drive to Q29 which acts as a current mirror to allow a fixed percentage of the summed current to be applied as an output signal, VO, at lead 710. Capacitor C3 filters high frequency AC noise from the analog output at lead 710. The fixed percentage of mirrored current supplied by Q29 may be, for example, about 20% of the summed current that flows through Q28.

The analog control voltage VO at lead 710, FIG. 6, supplies a VIN on MOS transistor Q5, FIG. 5A. DAC 145 thus supplies a variable current in incremental amounts for charging and discharging capacitor 300 at node point A. DAC 145 may be any type of digital to analog converter as is well known in the art. Internally, DAC 145 is set to deliver a range of current for each cell of from zero to about 12.5 milli amps. It should be noted that certain individual stages in VCO 100 do not receive an analog control voltage from DAC 145 and sense amplifier 700. These particular exceptions will be discussed in greater detail in connection with a more detailed study of the next lower circuit level for the two different speeds provided by the ring oscillator.

Input current applied to the individual cells is shown along the horizontal axis in the family of curves in FIG. 7. As there shown, the frequency range for each stage varies in accordance with a current supply from zero to about 12.5 milli amps. Since the DAC 145 is driven by counter 140, FIG. 1, the number of current increments total 256 steps before counter 140 rolls over and restarts the VCO on another frequency range associated with another current starved inverter cell. The next frequency range is selected by the next select pulse from decoder 160 which selects the next tandem-connected stage associated with the next progressively higher frequency range in the family of frequency curves.

Each step from DAC 140 is roughly 12 milli amps divided into 256 increments, or about 40 to 50 micro amps of digitally-controlled current that is fed via sense amplifier 700 as an analog control voltage into the selected cell. Whether the current continues to increase, or decrease, with each clock or not depends upon the nature of the "up" or "down" commands received by counter 140. In any event, however, these incremental current steps move the operation of a selected cell upward in frequency along its associated frequency curve of FIG. 7, and then to the next curve, etc., until stability is achieved.

In FIG. 2 the input lead labeled 205 of high speed frequency range 250 receives the analog control signal from DAC 145. A logic gate 240 divides the two left-hand stages A0, A1 from the other six stages A2 through A7. For reference purposes, the two left stages A0, A1 are designated as one ring oscillator chain 250, while the remaining stages are designated as ring oscillator chain 275. Obviously other dividing points other than between stages A1 and A2 could be selected without departing from the spirit and scope of the invention.

As will be described in more detail hereinafter, the broadband frequency operating range of the VCO 100 is of enhanced operation when the eight tandem stages are not connected as a single fixed length ring oscillator. Instead, the stages are broken into two separated ring oscillator chains 250 and 275 as shown in FIG. 2. Oscillator chain 250 is the higher frequency end and the lower frequency end of the entire spectrum is provided by ring oscillator chain 275.

A higher frequency end 250 requires that the amount of capacitance "seen" as a load by that stage not be the entire capacitance for all stages. Thus, breaking the oscillator into two chains reduces the capacitance that is "seen" by the high end stage A0 and A1. The parasitic capacitance associated with the metal gate leads and parasitic capacitance of stages A0 and A2 is a smaller load for the selection circuit and thus the section 250 may be faster with a higher frequency.

Broadly speaking, variations in a cell's design speed provide for a more equal spacing of frequency ranges between individual curves of the family of curves of FIG. 7. Turning now to those curves, please note the spacing between frequency ranges established by adjacent stages. As shown by the arrows 672, 673 associated with curves 660 and 650, these two curves (and any other curves, as well) can be brought closer together by the speed changes designed into certain cells shown in block form in FIG. 2. Breaking the oscillator chain provides for closer spacing in these higher frequency ranges.

Generally speaking, however, the ring oscillator could be of one fixed length and all stages could be identical without departing from the spirit and scope of the invention. That configuration is expressly within the scope of the definition for this invention. For such a fixed length ring oscillator, DAC 145, would provide an analog control signal in common to the tandem-connected stages. Also, each and every stage of the tandem delay stages of that ring oscillator could then be identical to other stages. For example, such stages could take the form of the typical stage 320 described above in connection with FIGS. 3A.

Shown in FIG. 2 is a logic and select network which includes elements 215, 225, 235 and 237. Selection of particular stages is provided by a select signal on elements 216 through 223 as earlier described. The P-type MOS transistors 215 and 225 together with the Nor gate 235 and inverter 237 are connected in such a manner that one, or the other, of the oscillator chains 250, 275 are operating. Thus, if either and/or both of the two first stages A0 and A1 of the left hand counter chain 250 are selected and thus oscillating, then the right hand chain 275 (stages A2 through A7) is not oscillating. Conversely, if the right hand chain 275 is oscillating then the left hand chain 250 is not. The logic and voltage conditions providing this separate operational status for divisions 250 and 275 are readily apparent and need no further explanation.

In order to more fully understand the reasons why the oscillator is broken into two chains 250 and 275, reference may be had first to a general operational description of FIG. 2, and then to the family of curves of FIG. 7. A digital select command at terminals 216 through 223 selects, with respect to FIG. 7, one of the family of curves upon which the VCO will operate for a given octal counting period. For the next counting period, assuming no "lock" occurs, the next highest frequency curve in the family is selected for operation.

Please examine FIG. 7. Shown there are eight separate frequency curves 610, 620, etc through 680. The legend in the upper left hand portion of the figure is associated with each curve and identifies that curve by the type of presentation used in the drawing, such as— for example—dashed, solid, darkened etc. The appropriate digital command for selecting that particular curve for VCO operation is depicted adjacent its curve. Associated with curve 610, for example, is a digital command identified as 000, digital command 001 selects curve 620, etc. as shown. The digital command is issued to the decoder 160, FIG. 1.

Before any digital command is issued an initial condition exists. For that initial condition, a master reset is initially applied to VCO 100, and counters 140, and 110. That reset clears the VCO and all of the counters to a 000 state. Accordingly, VCO 100 will start its operation at the lowest starting point on curve 610, which point is identified as point 600. Thereafter, counter 140, and decoder 160, FIG. 1, will move the VCO operation upward in frequency along the curve 610. Assuming no lock is achieved the circuitry automatically selects the next higher frequency curve 620 and if no lock occurs, then sequentially each curve in turn is selected until a lock does occur. This sequential curve selection is in the order shown by the advancement in the value of the digital select signals 000, 001, 010, etc.

A second control signal, a fine adjust, is an analog signal emitted from DAC 145. This analog control signal serves to move the starting point 600 from the initial zero current condition to the right along curve 610. Within the DAC converter incremental current amounts are developed into supplied analog voltages for each "up" command from the counter 140. Counter 140 will supply 256 counts for each digital select signal. Assuming, at this point a continuous "up" condition as first must occur for the reasons discussed earlier, these 256 counts will incrementally move the ring oscillator's operation to the right along curve 610.

Thus, the system staffs at a very small control voltage proportional to the current legend shown along the X axis in FIG. 7 and moves upwardly in frequency in response to a control voltage from sense amplifier 700, FIG. 6. As described earlier the control voltage from sense amplifier 700 is proportional to metered current as supplied from DAC 145. The maximum amount of DAC current is in the order of about 12.5 milli amps.

At the starting point 600, FIG. 7, the input current from the DAC 145 is initially a zero amount. One-of-eight decoder 160 responds to a 000 digital signal from counter 140 by issuing a select command on terminal 223, FIG. 2. Such a select command, a high on S(7), satisfies the feedback circuit 297 and an output signal is fedback to the input of stage A2. Thereafter, the coarse adjustment at S(7) by the select signal "000" maintains the extreme right hand stage A7 operable as a low frequency oscillator until DAC 145 has commanded a complete trace of the VCO operation along frequency range 610.

A feedback signal from cell 282 of stage A2, cascades down the entire string of cells A3, A4, A5, A6 and back to cell A7. This round trip delay for the signal sets the period T and thus the frequency of operation for the right hand section 275 of VCO 100.

The analog voltage at VIN is a fine tune control signal. In the case of cell 280, that control signal is immediately fed back from the delay cell 290 to the input of cell 280. The output of cell 280 likewise drives cell 281, and whether or not delay 291 supplies any feedback to cell 280, depends upon whether delay 291 is selected or not by a digital select command on lead 217.

Note that 280 includes a ground, understood but not shown in FIG. 2, as well as VCC and VIN. While cell 280 is connected in series, or tandem, with cell 281, cell 280 is also in parallel with the select and feedback circuit 290.

Figure 8:
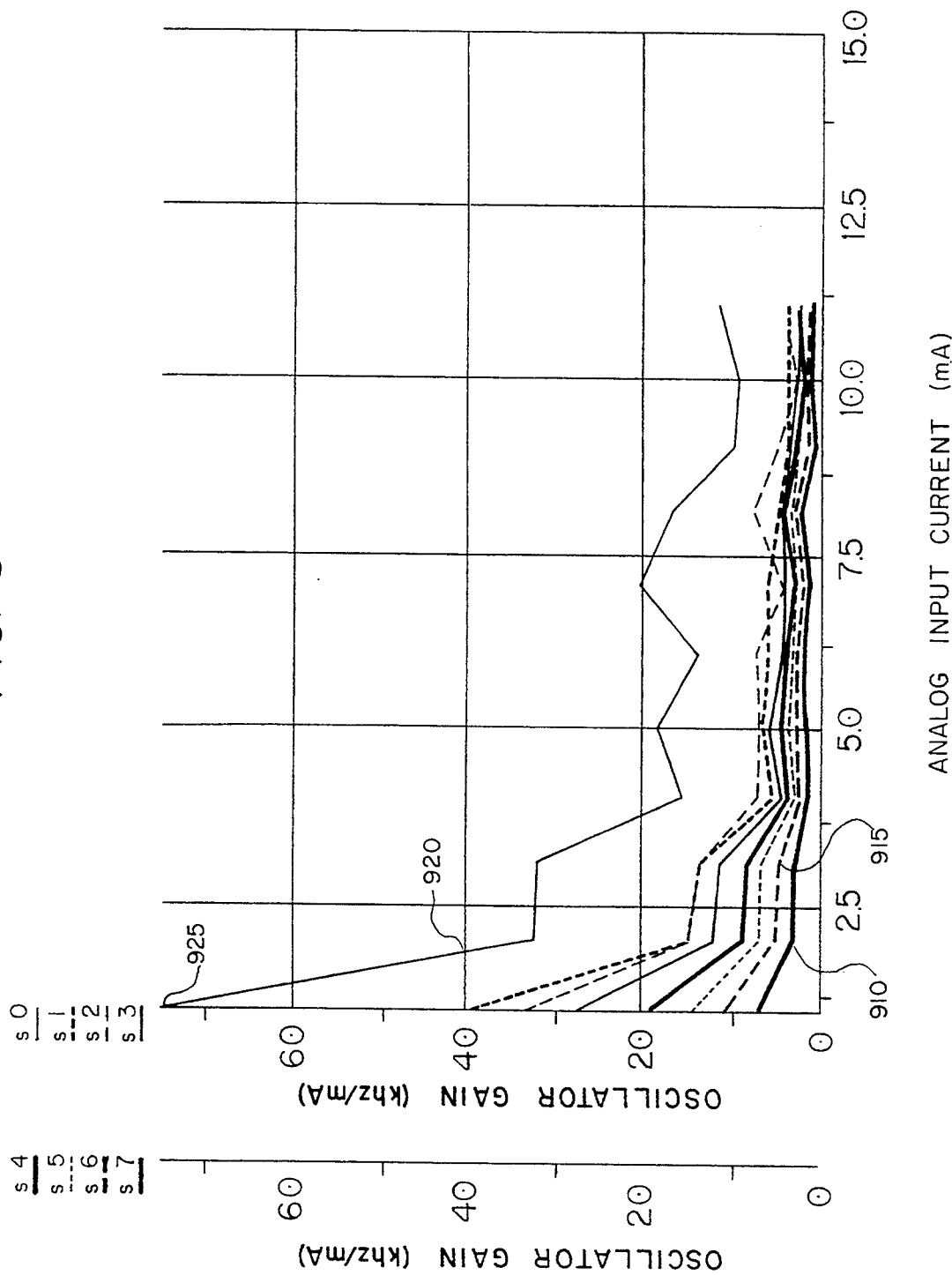
FIG. 8 is another waveform showing oscillator gain as a function of input current and digital decode signals applied to the ring oscillator of the invention.

In FIG. 8, the individual oscillator gain curves are depicted for all eight stages A0 through A7 as a function of analog input current. The legend in the upper left hand portion of FIG. 8 is associated with each gain curve and identifies that curve by the type of presentation used in the drawing, such as—for example—dashed, solid, darkened etc. The important aspect to note from FIG. 8 is that each individual gain curve 910, 915, and the like is essentially low in value over the majority of its operational range. For example as shown the operational range is less than 20 KHz per milli amp input.

As shown by FIG. 8, some high gain does take place as current starvation in order of the less than 2 milli amps is fed into the cell by DAC 145, FIG. 1. Even then, however, other overlapping curves present a more linear portion of lower gain for the VCO of this invention. Moreover, the high gain portion of the VCO of this invention, between points 920 and 925 for stage A0 is only for the highest frequency range, and thus is acceptable. Correlation of the curves of FIGS. 7 (and its derivative of FIG. 8) reflect that for the frequency range of interest—namely, about 0 to over 270 Mega hertz—the operation is both linear; and, relatively speaking, exhibits far lower gain than any VCO of the prior art. (Please see FIG. 4). The high gain regions are generally in the range of overlap areas where lock would not occur.

While my invention has been described with reference to a particular example of preferred embodiments, it is my intention to cover all modifications and equivalents within the scope of the following claims. It is therefore requested that the claims, which define my invention, be given a liberal interpretation which is within the spirit and scope of my contribution to the art.

What is claimed is:

1. A method of compensating for a non-linear region of high gain in a ring oscillator, said method comprising:
   representing the metal layers forming gates and various stray capacitance as a capacitor to be charged and discharged at an oscillating frequency for said oscillator;
   charging and discharging said capacitor by a variable current supplied through a series circuit by a current starved inverter; and
   compensating for said high gain and non-linear region by an anti high-gain circuit having a source of fixed charging and discharging current in parallel with said variable current supplied by said current starved inverter.

2. The method of claim 1 further comprising the steps of:
   automatically controlling the amount of variable current for said oscillator in order to establish a finite operational frequency range for said oscillator.

3. The method of claim 2 comprising the additional steps of:
   providing a broadband low-gain linear ring oscillator;
   assembling, for said oscillator, a family of individual finite frequency bands which each progressively adds to a combined operational broadband frequency range;
   connecting a plurality of said individual oscillators in tandem to one another; and
   feeding back a signal from each successive oscillator to the first oscillator in the tandem connection in order to form said broadband ring oscillator.

4. A ring oscillator comprising a plurality of stages connected in tandem, each stage of said plurality of stages providing a frequency response and having:
   i. a digital input terminal,
   ii. an inverter having an input, an output and a feedback connection from said output to said input, and
   iii. an anti-high-gain circuit coupled to said inverter, wherein one of said plurality of stages is actuated in response to a digital control signal at said digital input terminal and said frequency response of the actuated stage is adjusted in response to an analog control signal.

5. Ring oscillator of claim 4 comprising a three-state select circuit for controlling feedback at said inverter, said three-state select circuit coupled to said inverter and coupled to said digital input terminal.

6. Ring oscillator of claim 5 wherein said plurality of stages are connected to form at least two separate ring oscillator chains, each of said oscillator chains having one or more of said stages, and wherein a first oscillator chain of said separate ring oscillator chains is a low-frequency end and a second oscillator chain of said separate ring oscillator chains is a high-frequency end.

7. Ring oscillator of claim 6 further comprising a logic and select network coupled to at least two of said plurality of stages.

8. Ring oscillator of claim 5 wherein the total number of stages in said ring oscillator is a finite number, n, and wherein a one-out-of-n selection actuates one of said stages.

9. Ring oscillator of claim 5 wherein said anti-high-gain circuit comprises a first fixed current source and a second fixed current source, said first fixed current source coupled to a high-voltage node of said inverter and said second fixed current source coupled to a low-voltage node of said inverter.

10. Ring oscillator of claim 5 wherein said inverter is a CMOS inverter.

11. Ring oscillator of claim 5 with each of said plurality of stages further comprising a current mirror coupled to said inverter and an independent reference current source coupled to said current mirror.

12. A voltage-controlled ring oscillator comprising a plurality of stages connected in tandem, each stage of said plurality of stages having:
  i. an input terminal,
  ii. an output terminal,
  iii. a first current source, a second current source, a third current source, and fourth current source,
  iv. an inverter having a high-voltage node, a low-voltage node, an inverter input, an inverter output and a feedback connection from said inverter output to said inverter input, said first and second current sources coupled to said high-voltage node and said third and fourth current sources coupled to said low-voltage node,
  v. a three-state select circuit coupled to said inverter and coupled to said input terminal, wherein a first control signal actuates one of said plurality of stages and a second control signal adjusts a frequency response of the actuated stage.

13. Voltage-controlled ring oscillator of claim 12 wherein said plurality of stages are connected to form at least two separate ring oscillator chains, each said oscillator chain having one or more of said stages, and where a first oscillator chain is a low-frequency end and a second oscillator chain is a high-frequency end.

14. Voltage-controlled ring oscillator of claim 13 further comprising a logic and select network coupled to at least two of said plurality of stages.

15. Voltage-controlled ring oscillator of claim 12 wherein said first current source and said third current source are fixed current sources and said second current source and said fourth current source are variable current sources and said third current source is coupled in parallel with said fourth current source.

16. Voltage-controlled ring oscillator of claim 12 wherein said first control signal is a digital signal and said second control signal is an analog signal.

* * * * *